(12) United States Patent
Van Heumen et al.

(10) Patent No.: US 11,804,358 B2
(45) Date of Patent: *Oct. 31, 2023

(54) SYSTEM AND METHODS FOR THERMALLY CONDITIONING A WAFER IN A CHARGED PARTICLE BEAM APPARATUS

(71) Applicant: ASML Netherlands B.V., Veldhoven (NL)

(72) Inventors: Martijn Petrus Christianus Van Heumen, Santa Clara, CA (US); Jeroen Gerard Gosen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/493,837

(22) Filed: Oct. 4, 2021

(65) Prior Publication Data

US 2022/0102106 A1    Mar. 31, 2022

Related U.S. Application Data

(63) Continuation of application No. 16/675,192, filed on Nov. 5, 2019, now Pat. No. 11,139,141.

(Continued)

(51) Int. Cl.
*H01J 37/20* (2006.01)
*H01L 21/67* (2006.01)

(52) U.S. Cl.
CPC ........ *H01J 37/20* (2013.01); *H01L 21/67288* (2013.01); *H01J 2237/2001* (2013.01); *H01J 2237/2814* (2013.01)

(58) Field of Classification Search
CPC .............. H01J 37/20; H01J 2237/2001; H01J 2237/2814; H01L 21/627288
See application file for complete search history.

(56) References Cited

U.S. PATENT DOCUMENTS 7,577,493 B2 * 8/2009 Sugishita ............... G05B 11/42
                                                    438/362
9,575,418 B2    2/2017 Kuiper et al.
(Continued)

FOREIGN PATENT DOCUMENTS

CN    101040235 A      9/2007
JP    2001222099 A  *  8/2001
(Continued)

OTHER PUBLICATIONS

Office Action issued by the Taiwanese Patent Office issued in related TW Application No. 108138528, dated Aug. 5, 2020 (12 pgs.).
(Continued)

*Primary Examiner* — David E Smith
(74) *Attorney, Agent, or Firm* — Finnegan, Henderson, Farabow, Garrett & Dunner, LLP

(57) ABSTRACT

An improved particle beam inspection apparatus, and more particularly, a particle beam inspection apparatus including a thermal conditioning station for preconditioning a temperature of a wafer is disclosed. The charged particle beam apparatus may scan the wafer to measure one or more characteristics of the structures on the wafer and analyze the one or more characteristics. The charged particle beam apparatus may further determine a temperature characteristic of the wafer based on the analysis of the one or more characteristics of the structure and adjust the thermal conditioning station based on the temperature characteristic.

20 Claims, 10 Drawing Sheets

Related U.S. Application Data

(60) Provisional application No. 62/756,483, filed on Nov. 6, 2018.

(56) References Cited

U.S. PATENT DOCUMENTS

| | | | |
|---|---|---|---|
| 9,665,013 | B2 | 5/2017 | De Boer et al. |
| 10,114,290 | B2 | 10/2018 | Nomura |
| 10,403,503 | B2 * | 9/2019 | Farley ............... H01L 21/67115 |
| 11,139,141 | B2 * | 10/2021 | Van Heumen ........ H01J 37/222 |
| 2005/0118781 | A1 | 6/2005 | Berge et al. |
| 2006/0022694 | A1 | 2/2006 | Brunner et al. |
| 2008/0044257 | A1 * | 2/2008 | England ............ H01L 21/67063 |
| | | | 414/172 |
| 2011/0291030 | A1 | 12/2011 | Lee |
| 2012/0272892 | A1 | 11/2012 | Paranjpe et al. |
| 2014/0034846 | A1 * | 2/2014 | Lee .................... H01J 37/3171 |
| | | | 250/453.11 |
| 2015/0060690 | A1 * | 3/2015 | Yashima ............. H01J 37/1472 |
| | | | 250/396 R |
| 2015/0340198 | A1 * | 11/2015 | Nakagawa ............ H01J 37/185 |
| | | | 250/441.11 |
| 2017/0040141 | A1 * | 2/2017 | Huseinovic ............. H01J 37/20 |
| 2018/0053666 | A1 * | 2/2018 | Babayan ........... H01L 21/67248 |

FOREIGN PATENT DOCUMENTS

| | | | |
|---|---|---|---|
| JP | 2001222099 | A | 8/2001 |
| JP | 2011017569 | A | 1/2011 |
| JP | 2013527578 | A | 6/2013 |
| JP | 2013 229188 | A | 11/2013 |
| JP | 2015008224 | A | 1/2015 |
| JP | 6018789 | B2 * | 11/2016 |
| TW | 201246297 | A | 11/2012 |
| TW | 201730684 | A | 9/2017 |

OTHER PUBLICATIONS

Notice of Reasons for Rejection issued in related Japanese Patent Application No. 2021-521500; dated May 2, 2022 (6 pgs.).

* cited by examiner

SYSTEM AND METHODS FOR THERMALLY CONDITIONING A WAFER IN A CHARGED PARTICLE BEAM APPARATUS

CROSS-REFERENCE TO RELATED APPLICATIONS

This application is a continuation of application Ser. No. 16/675,192, filed Nov. 5, 2019, which claims priority of U.S. application 62/756,483 which was filed on Nov. 6, 2018. These applications are incorporated herein by reference in their entireties.

FIELD

The embodiments provided herein disclose a charged particle beam inspection apparatus, and more particularly, a particle beam inspection apparatus including a thermal conditioning station for preconditioning a temperature of a wafer.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the sample. By scanning the probe spot over the sample surface and collecting the secondary electrons, pattern inspection tools may obtain an image of the sample surface.

During operation of an inspection tool, the wafer is typically held by a wafer stage. The inspection tool may comprise a wafer positioning device for positioning the wafer stage and wafer relative to the e-beam. This may be used to position a target area on the wafer, e.g., an area to be inspected, in an operating range of the e-beam.

SUMMARY

The embodiments provided herein disclose a charged particle beam inspection apparatus, and more particularly, a particle beam inspection apparatus including a thermal conditioning station for preconditioning a temperature of a wafer.

In some embodiments, a method for determining a temperature characteristic of a wafer using a charged particle beam apparatus is provided. The wafer may include a plurality of structures. The method may include scanning the wafer with the charged particle beam apparatus to measure one or more characteristics of the plurality of structures on the wafer. The method may also include analyzing the one or more characteristics of the plurality of structures. The method may further include determining the temperature characteristic based on the analysis of the one or more characteristics of the plurality of structures.

In some embodiments, a method for adjusting a charged particle beam apparatus with a thermal conditioning station is provided. The method may include scanning a wafer on a wafer stage with the charged particle beam apparatus to measure one or more characteristics of a plurality of structures on the wafer and analyzing the one or more characteristics of the plurality of structures. The method may also include determining a temperature characteristic of the wafer based on the analysis of the one or more characteristics of the plurality of structures. The method may further include adjusting the thermal conditioning station based on the temperature characteristic.

In some embodiments, a charged particle beam apparatus may include a thermal conditioning station configured to precondition a wafer temperature and a particle beam imaging tool to generate one or more images of a wafer on a wafer stage. The charged particle beam apparatus may further include a controller having circuitry to cause the charged particle beam apparatus to perform various steps. The steps may include scanning the wafer with the particle beam imaging tool to measure one or more characteristics of a plurality of structures on the wafer and analyzing the one or more characteristics of the plurality of structures. The steps may also include determining a temperature characteristic of the wafer based on the analysis of the one or more characteristics of the plurality of structures and adjusting the thermal conditioning station based on the temperature characteristic.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1A:
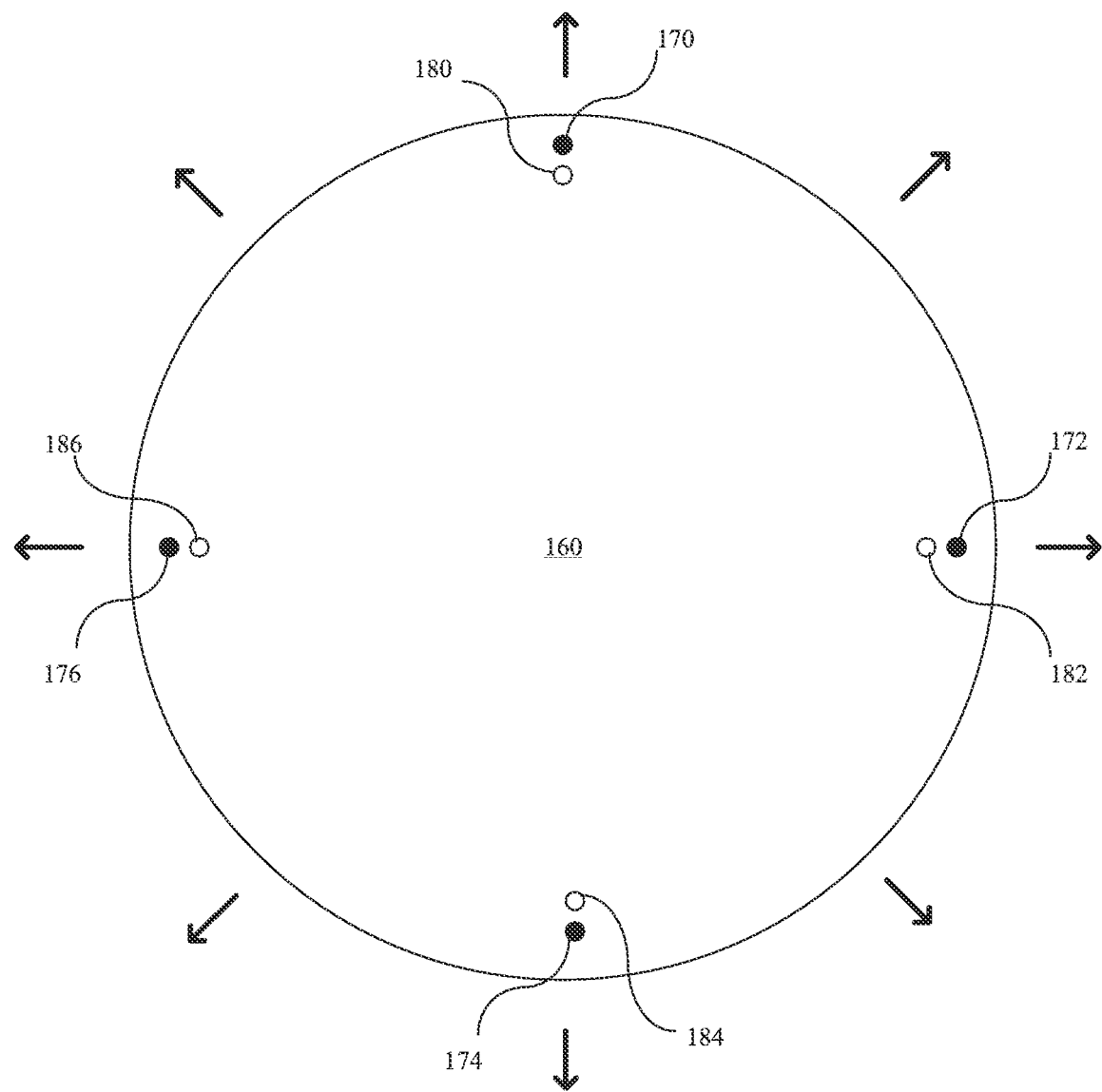
FIG. 1A is a schematic diagram illustrating an exemplary wafer deformation effect in a charged particle beam inspection system.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process yield is desirable in an IC chip manufacturing facility, maintaining a high wafer throughput, defined as the number of wafers processed per hour, is also essential. High process yield and high wafer throughput can be impacted by the presence of defects, especially if operator intervention is required for reviewing the defects. Thus, high throughput detection and identification of micro and nano-sized defects by inspection tools (such as a SEM) is essential for maintaining high yield and low cost.

A SEM scans the surface of a wafer with a focused beam of electrons. The electrons interact with the wafer and generate secondary electrons. By scanning the wafer with an electron beam and capturing the secondary electrons with a detector, a SEM creates an image of the wafer that shows the internal device structure in the area of the wafer being inspected.

One of the problems with a conventional inspection system is that a wafer being scanned may change its shape or size while the scanning is in progress. For example, when the wafer is placed on an inspection platform, the temperature of wafer can be different from the temperature of the platform. This temperature difference may cause a wafer temperature drift (e.g., the temperature of the wafer gradually and continuously changes towards a stable point, which is usually close to the temperature of the inspection system), thereby resulting in the change in the shape or size of the wafer. If the wafer temperature increases, the wafer would expand; if the wafer temperature decreases, the wafer would shrink. This change in the shape or size of the wafer can cause inaccurate inspection results.

Therefore, an operator, who is inspecting a wafer using a conventional particle beam inspection system, needs to wait for the wafer to become temperature-stabilized before starting the inspection. This temperature stabilization is required because the wafer changes size as the temperature changes, which causes elements on the wafer to move as the wafer expands or contracts. For example, FIG. 1A shows that elements 180, 182, 184, and 186 can move to new locations 170, 172, 174, and 178 as a wafer 160 expands due to the temperature change. And when the precision for inspecting a wafer is in nanometers, this change in location is material. Accordingly, for the operator to precisely locate and inspect the elements on the wafer, the operator must wait until the wafer temperature stabilizes. Therefore, for high throughput inspection, some of the newer inspection systems perform a thermal conditioning of a wafer before placing the wafer on the inspection platform. By making the wafer temperature close to the temperature of the wafer stage before placing the wafer onto the wafer stage, the inspection can begin with much less delay. Therefore, the operator can inspect more wafers within a given period of time, thereby achieving an increased throughput.

If the inspection system can use the actual temperature of the wafer, the thermal conditioning process can be further optimized. However, measuring the actual wafer temperature is difficult.

Placing a thermometer on the wafer can contaminate the inspection environment with unwanted particles (e.g., dust), which can degrade the accuracy of wafer inspection. Contactless thermometers, like Infrared (IR) temperature sensors, may avoid the contamination problem, but the accuracy of IR sensors is still too low for this purpose.

One aspect of the present disclosure includes systems and methods that can measure the temperature characteristics of the wafer indirectly and with adequate accuracy without using any component, such as a thermometer, that can contaminate the inspection environment. As described earlier with respect to FIG. 1A, the wafer can change the size (e.g., expand or shrink) when the wafer temperature is changing. Therefore, the wafer size change is closely related to the wafer temperature change. By obtaining multiple images of the wafer and comparing the locations of some of structures on the wafer, the temperature characteristics of the wafer can be determined with the required accuracy, and without causing any contamination.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Figure 1B:
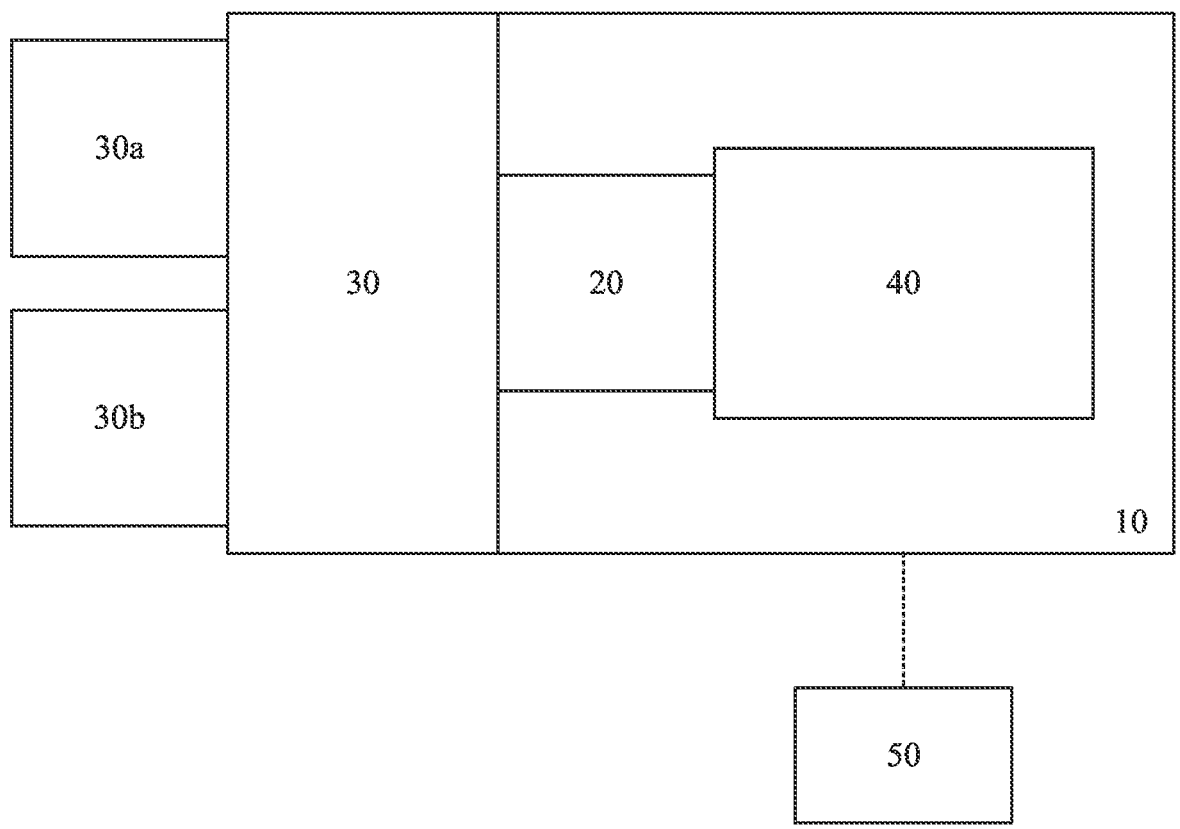
FIG. 1B a schematic diagram illustrating an exemplary charged particle beam inspection system, consistent with embodiments of the present disclosure.

Reference is now made to FIG. 1B, which is a schematic diagram illustrating an exemplary charged particle beam inspection system 100, consistent with embodiments of the present disclosure. As shown in FIG. 1B, charged particle beam inspection system 100 may include a main chamber 10, a load lock chamber 20, an electron beam tool 40, and an equipment front end module (EFEM) 30. Electron beam tool 40 may be located within main chamber 10. While the description and drawings are directed to an electron beam, it is appreciated that the embodiments are not used to limit the present invention to specific charged particles. It is further appreciated that electron beam tool 40 can be a single-beam tool utilizing a single electron beam or a multi-beam tool utilizing multiple electron beams.

EFEM 30 may include a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (e.g., robot arm 11 shown in FIG. 1C) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (e.g., robot arm 12 shown in FIG. 1C) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40.

A controller 50 may be electronically connected to electron beam tool 40 or any other parts of charged particle beam inspection system 100. Controller 50 may be a computer configured to execute various controls of charged particle beam inspection system 100. Controller 50 may also include a processing circuitry configured to execute various signal and image processing functions. While controller 50 is shown in FIG. 1B as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 1C:
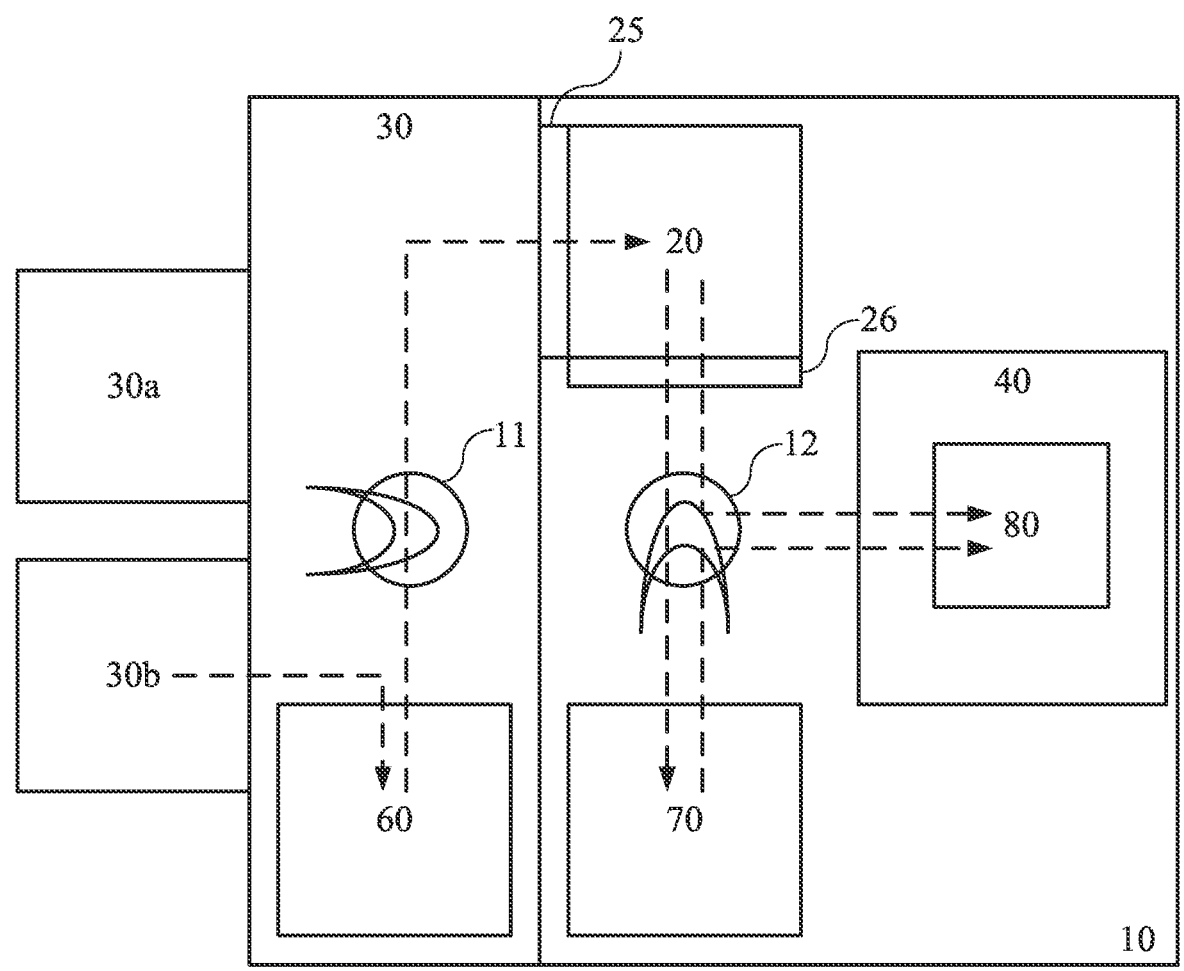
FIG. 1C is a schematic diagram illustrating an exemplary wafer loading sequence in the charged particle beam inspection system of FIG. 1B, consistent with embodiments of the present disclosure.

Reference is now made to FIG. 1C, which is a schematic diagram illustrating an exemplary wafer loading sequence in charged particle beam inspection system 100 of FIG. 1B, consistent with embodiments of the present disclosure. In some embodiments, charged particle beam inspection system 100 may include a robot arm 11 located in EFEM 30 and a robot arm 12 located in main chamber 10. In some embodiments, EFEM 30 may also include a pre-aligner 60 configured to position a wafer accurately before transporting the wafer to load lock chamber 20.

In some embodiments, first loading port 30a and second loading port 30b, for example, may receive wafer front opening unified pods (FOUPs) that contain wafers. Robot arm 11 in EFEM 30 may transport the wafers from any of the loading ports to pre-aligner 60 for assisting with the positioning. Pre-aligner 60 may use mechanical or optical aligning methods to position the wafers. After pre-alignment, robot arm 11 may transport the wafers to load lock chamber 20.

After the wafers are transported to load lock chamber 20, a load lock vacuum pump (not shown) may remove gas molecules in load lock chamber 20 to reach a first pressure below the atmospheric pressure. After reaching the first pressure, a robot arm 12 may transport the wafer from load lock chamber 20 to a wafer stage 80 of electron beam tool 40 in main chamber 10. Main chamber 10 is connected to a main chamber vacuum pump system (not shown), which removes gas molecules in main chamber 10 to reach a second pressure below the first pressure. After reaching the second pressure, the wafer may be subject to inspection by electron beam tool.

In some embodiments, main chamber 10 may include a parking station 70 configured to temporarily store a wafer before inspection. For example, when the inspection of a first wafer is completed, the first wafer may be unloaded from wafer stage 80, and then robot arm 12 may transport a second wafer from parking station 70 to wafer stage 80. Afterwards, robot arm 12 may transport a third wafer from load lock chamber 20 to parking station 70 to temporarily store the third wafer until the inspection for the second wafer is finished.

In some embodiments, to improve the overall throughput of inspection system, charged particle beam inspection system 100 may perform a thermal conditioning of a wafer before loading the wafer onto wafer stage 80. This pre-inspection thermal conditioning may occur in pre-aligner 60, load lock chamber 20, parking station 70, or any other place suitable for thermally conditioning the wafer before moving it to wafer stage 80.

Figure 2:
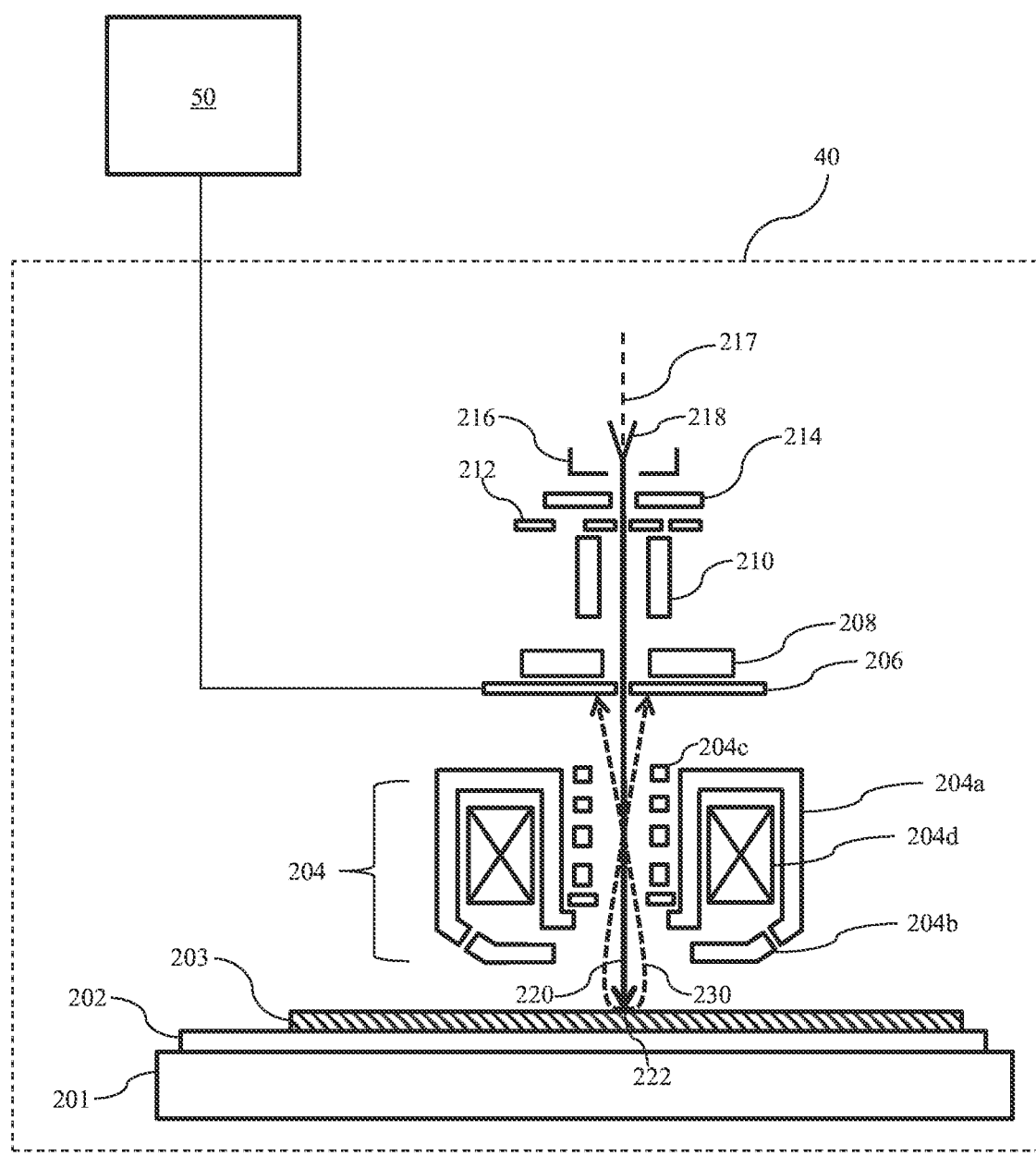
FIG. 2 is a schematic diagram illustrating an exemplary electron beam tool, consistent with embodiments of the present disclosure.

Reference is now made to FIG. 2, which is a schematic diagram illustrating an exemplary inspection system 200 that may be part of the charged particle beam inspection system of FIGS. 1B and 1C, consistent with embodiments of the present disclosure. Inspection system 200 may include an electron beam tool 40 and a controller 50.

Electron beam tool 40 may include a motorized wafer stage 201 (similar to wafer stage 80 of FIG. 1C). Electron beam tool 40 may also include a wafer holder 202 supported by motorized wafer stage 201 to hold a wafer 203 to be inspected. Electron beam tool 40 may further include a compound objective lens 204, electron detector 206 (which includes electron sensor surfaces), an objective aperture 208, a condenser lens 210, a beam limit aperture 212, a gun aperture 214, an anode 216, and a cathode 218, one or more of which may be aligned with an optical axis 217 of electron beam tool 40. In some embodiments, detector 206 may be arranged off axis 217.

Compound objective lens 204, in some embodiments, may include a modified swing objective retarding immersion lens (SORIL), which may include a pole piece 204a, a control electrode 204b, a deflector or a set of deflectors 204c, and an exciting coil 204d. In some embodiments, electron beam tool 40 may additionally include an energy dispersive X-ray spectrometer (EDS) detector (not shown) to characterize the materials on the wafer.

A primary electron beam 220 may be emitted from cathode 218 by applying a voltage between anode 216 and cathode 218. Primary electron beam 220 may pass through gun aperture 214 and beam limit aperture 212, both of which may determine the current of electron beam entering condenser lens 210, which resides below beam limit aperture 212. Condenser lens 210 may focus primary electron beam 220 before the beam enters objective aperture 208 to set the current of the electron beam before entering compound objective lens 204.

Compound objective lens 204 may focus primary electron beam 220 onto wafer 203 for inspection and can form a probe spot 222 on surface of wafer 203. Deflector(s) 204c may deflect primary electron beam 220 to scan probe spot 222 over wafer 203. For example, in a scanning process, deflector(s) 204c may be controlled to deflect primary electron beam 220 sequentially onto different locations of top surface of wafer 203 at different time points, to provide data for image reconstruction for different parts of wafer 203. Moreover, in some embodiments, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 40 may include a plurality of deflectors 204c to project the multiple primary electron beams 220 to different parts/sides of wafer 203 at the same time.

When a current is applied onto exciting coil 204d, an axially-symmetric (i.e., symmetric around optical axis 217) magnetic field may be generated in the wafer surface area. A part of wafer 203 being scanned by primary electron beam 220 may be immersed in the magnetic field. In some embodiments, different voltages may be applied onto wafer 203, pole piece 204a, and control electrode 204b, to generate an axial symmetric retarding electric field near the wafer surface. The electric field may reduce the energy of impinging primary electron beam 220 near the surface of the wafer before electrons of the beam collide with wafer 203. Control electrode 204b, being electrically isolated from pole piece 204a, may control an axially-symmetric electric field on the wafer to prevent micro-arcing of the wafer and to ensure proper beam focus at the wafer surface with the axially-symmetric magnetic field together.

A secondary electron beam 230 may be emitted from the part of wafer 203 upon receiving primary electron beam 220. Secondary electron beam 230 may comprise backscattered electrons, secondary electrons, or Auger electrons, resulting from the interactions of the primary electrons with wafer 203. Secondary electron beam 230 may be received by sensor surfaces of electron detector 206. In some embodiments, electron detector 206 may generate a signal (e.g., a voltage, a current, etc.) that represents an intensity of secondary electron beam 230 and may provide the signal to controller 50 in communication with electron detector 206. The intensity of secondary electron beam 230 may vary according to the external or internal structure of wafer 203, and thus may indicate whether wafer 203 includes defects. Moreover, as discussed above, primary electron beam 220 may be projected onto different locations of the top surface of wafer 203, or different sides of wafer 203 at a particular location, to generate secondary electron beams 230 of different intensities. Therefore, by mapping the intensity of secondary electron beam 230 with the areas of wafer 203, image processing circuitry in controller 50 may reconstruct an image that reflects the characteristics of internal or external structures of wafer 203.

In some embodiments, controller 50 may comprise image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detector 206 of electron beam tool 40 through a medium such as an electrical conductor, optical fiber cable, portable storage media, IR, Bluetooth, internet, wireless network, wireless radio, among others, or a combination thereof. In some embodiments, the image acquirer may receive a signal from electron detector 206 and may construct an image. The image acquirer may thus acquire images of wafer 203. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of wafer 203 based on an imaging signal received from detector 206. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of wafer 203. The acquired images may comprise multiple images of a single imaging area of wafer 203 sampled multiple times over a time sequence. The multiple images may be stored in storage 270. In some embodiments, controller 50 may be configured to perform image processing steps with the multiple images of the same location of wafer 203.

In some embodiments, controller 50 may include measurement circuitries (e.g., analog-to-digital converters) to obtain a distribution of the detected secondary electrons. The electron distribution data collected during a detection time window, in combination with corresponding scan path data of primary electron beam 220 incident on the wafer surface, can be used to reconstruct images of the wafer structures under inspection. The reconstructed images can be used to reveal various features of the internal or external structures of wafer 203, and thereby can be used to reveal any defects that may exist in the wafer.

In some embodiments, controller 50 may perform a wafer alignment process. The alignment process may include analyzing one or more images of wafer 203 with respect to a reference image. The wafer image may show one or more structures or patterns on the wafer, wherein the structures or the patterns are embedded on the wafer during a semiconductor manufacturing process. Controller 50 may analyze the wafer image and compare the locations of the one or more structures to the locations of the structures in the reference image. Controller 50 may adjust system configuration to compensate the amount of misalignment.

Moreover, although FIG. 2 shows that electron beam tool 40 uses a single primary electron beam, it is appreciated that electron beam tool 40 may also be a multi-beam inspection tool that uses multiple primary electron beams. The present disclosure does not limit the number of primary electron beams used in electron beam tool 40.

Figure 3:
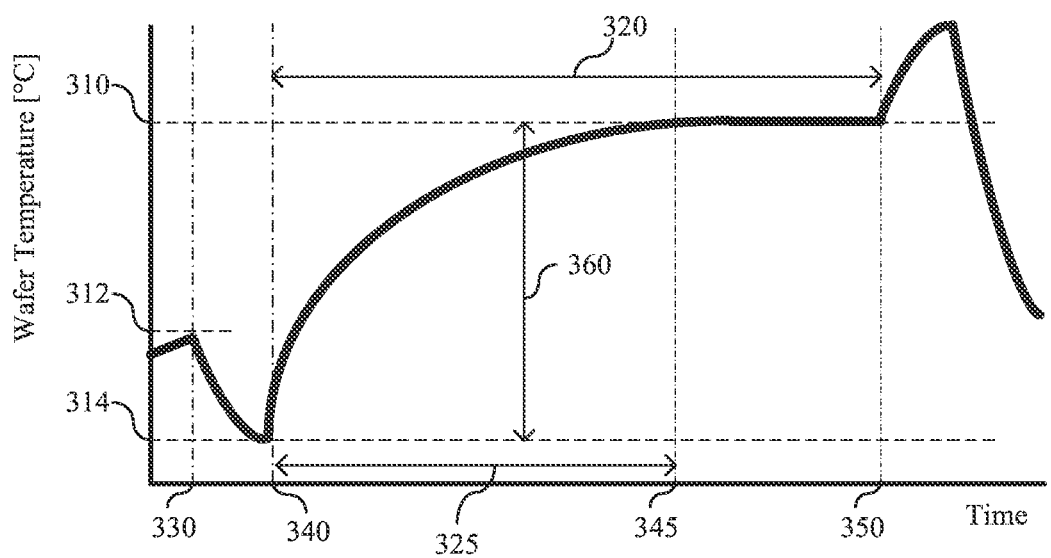
FIG. 3 is an exemplary graph showing a wafer temperature change over time in a charged particle beam inspection system.

Reference is now made to FIG. 3, which is an exemplary graph showing a wafer temperature change over time for a charged particle beam inspection system. The vertical axis represents temperature change, and the horizontal axis represents passage of time. The graph shows that the wafer temperature changes over time while the wafer is processed through multiple stages of wafer load sequence. At time 330, the wafer is loaded to a load lock chamber. At time 340, the wafer is transported and loaded to wafer stage. At time 345, a wafer inspection begins. At time 350, the wafer inspection ends, and the wafer is unloaded from the wafer stage. During period 320, the wafer stays on the wafer stage.

According to the exemplary data shown in FIG. 3, when a wafer is loaded to the load lock chamber at time 330, the temperature of the wafer is approximately 22 degrees (annotated as 312). After the wafer is transported to a load lock chamber, the wafer temperature sharply drops from temperature 312 to temperature 314. Exemplary data show that this temperature drop, which occurs when the load lock chamber is pumped down to a vacuum, may be approximately one to two degrees. This sudden temperature drop is referred to as a pump-down effect.

Subsequently, when the wafer is transported and loaded onto the wafer stage (e.g., wafer stage 80 of FIG. 1C) at time 340, the wafer temperature (annotated 314) and the wafer stage temperature (not shown, but close to an equilibrium temperature 310) may be at different temperatures. Exemplary data show that this difference may be approximately up to three degrees.

This temperature difference between the wafer and the wafer stage causes wafer temperature drift towards the wafer stage temperature. For example, the graph in FIG. 3 shows that the wafer temperature changes during period 320. Under such circumstances, heat transfer occurs between the wafer and the wafer stage, thereby resulting in a deformation (e.g., a thermal expansion shown in FIG. 1A) of the wafer (or the wafer stage). While the wafer stage or wafer is undergoing a thermal deformation, the inspection of the target area may not be possible or may have a reduced accuracy. Thus, to perform a more accurate inspection, the system waits for a significant period of time (waiting period 325) until the wafer temperature stabilizes at an equilibrium temperature 310 before an inspection can commence at time 345. Therefore, reducing waiting period 325 may improve the throughput of the inspection system. In some embodiments, the wafer may be thermally preconditioned to reduce temperature difference 360, thereby resulting in shorter waiting period 325.

An example of wafer stage for quicker temperature stabilization may be found in European Patent Application No. EPI 8174642.1, titled PARTICLE BEAM APPARATUS and filed on May 28, 2018, which is incorporated by reference in its entirety. Another way to cope with this long stabilization time is conditioning the wafer temperature by pre-heating or pre-cooling the wafer to match the temperature of the wafer stage before the wafer is loaded onto the wafer stage. Examples of such embodiments may be found in U.S. Patent Application No. 62/699,643, titled PARTICLE BEAM INSPECTION APPARATUS and filed on Jul. 17, 2018, which is incorporated by reference in its entirety.

Figure 4:
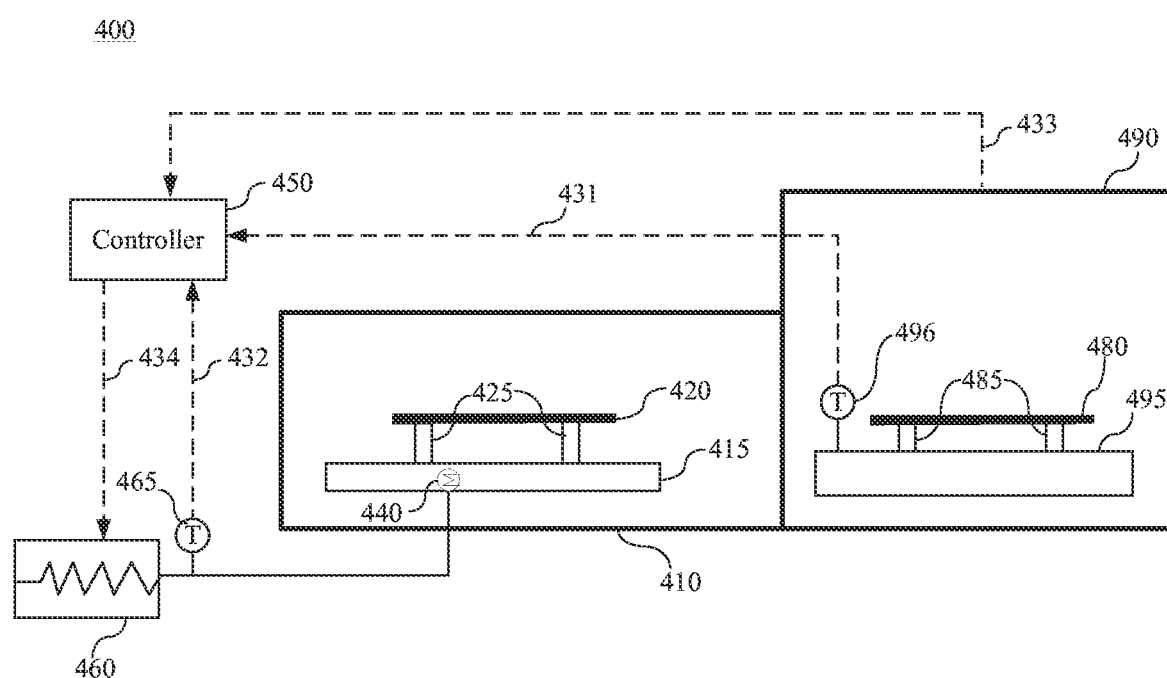
FIG. 4 is a schematic diagram of an exemplary charged particle beam inspection system with a thermal conditioning station, consistent with embodiments of the present disclosure.

Reference is now made to FIG. 4, which shows an exemplary charged particle beam inspection system 400 with a thermal conditioning station 410, consistent with embodiments of the present disclosure. In some embodiments, inspection system 400 may include thermal conditioning station 410, a main chamber 490, a controller 450, and a heater/cooler 460. Main chamber 490 may include an electron beam tool (not shown; such as electron beam tool 40 of FIG. 2) to obtain images of a wafer 480 (a wafer currently under inspection). While inspection of wafer 480 is in progress, thermal conditioning station 410 may perform a thermal conditioning of a wafer 420 (a wafer in line to be inspected after wafer 480 inspection is completed) to change the temperature of wafer 420 in preparation for the inspection step.

In some embodiments, thermal conditioning station 410 may include a plurality of supporting structures 425 and a conditioning plate 415 configured to transfer heat to wafer 420. In other embodiments, conditioning plate 415 may be configured to additionally or alternatively transfer heat from wafer 420. Supporting structures 425, coupled to conditioning plate 415, may support wafer 420 such that there is a space between wafer 420 and conditioning plate 415. While it is appreciated that more efficient heat transfer may be achieved as wafer 420 is positioned closer to conditioning plate 415, in some embodiments, it may be desirable to have sufficient distance in between wafer 420 and conditioning plate 415 to provide space for a robot arm to lift or transport wafer 420. In some embodiments, the distance between wafer 420 and conditioning plate 415 may be in a range of 1.5 mm to 10 mm to provide space to accommodate a variety of robot arm sizes in lifting or transporting a wafer. In some embodiments, the distance between wafer 420 and conditioning plate 415 may be in a range of 3 mm to 5 mm to provide space to accommodate a certain type of robot arms while providing more efficient heat transfer, without requiring a special treatment for robot arm transportation. In some embodiments, a special mechanism for lifting wafer 420 may be used, allowing the distance to be narrower.

Furthermore, even if two supporting structures 425 are shown in FIG. 3A, it is appreciated that thermal conditioning station 410 may include any number of supporting structures 425. In some embodiments, wafer 420 may be passively placed on top of supporting structures 425 without any means of active coupling (e.g. electrostatic clamping). In other embodiments, wafer 420 may be held onto supporting structures 425 using an active holding mean, such as electrostatic clamping.

In some embodiments, a pre-aligner (such as pre-aligner 60 of FIG. 1C) may function as thermal conditioning station 410. In some embodiments, a parking station (such as parking station 70 of FIG. 1C) may function as thermal conditioning station 410.

In some embodiments, a load lock chamber (such as load lock chamber 20 of FIG. 1C) may function as thermal conditioning station 410. In such embodiments, the load lock chamber (i.e., thermal conditioning station 410) may be configured to change the internal pressure between atmospheric and vacuum. A pump, such as a turbo pump (not shown), may be connected to the load lock chamber to maintain a vacuum level at an appropriate level for conditioning the temperature of wafer 420. It is appreciated that the pump may be a type of pump different from a turbo pump as long as the pump is suitable for establishing a vacuum in the load lock chamber.

In some embodiments, conditioning plate 415 may include a heat transfer element 440 configured to change the temperature of conditioning plate 415, which in turn affect the temperature of wafer 420. Heat transfer element 440 may be coupled to heater/cooler 460. In some embodiments, heater/cooler 460 may be placed outside of thermal conditioning station 410. In other embodiments, heater/cooler 460 may be placed inside of thermal conditioning station 410.

Controller 450 may be configured to adjust heater/cooler 460 or heat transfer element 440, via a control signal 434, to change the temperature of conditioning plate 415, which in turn affects the temperature of wafer 420. In some embodiments, controller 450 may perform various analyses based on multiple data inputs (e.g., via communication channels 431, 432, and 433) to adjust a temperature setpoint for the thermal conditioning process, thereby controlling heater/cooler 460 or heat transfer element 440 via control signal 434.

In some embodiments, controller 450 may receive a stage-temperature data about the temperature of wafer stage 495 in a main chamber 490. For example, controller 450 may receive, via communication channel 431, an electric signal conveying the stage-temperature data from a temperature sensor 496 configured to measure the temperature of wafer stage 495. In such embodiments, controller 450 may adjust the temperature setpoint of thermal conditioning process based on the received stage-temperature data of wafer stage 495 and control heater/cooler 460 to adjust the temperature of conditioning plate 415 according to the adjusted temperature setpoint.

Controller 450 may additionally or alternatively use information from the electron beam tool to adjust thermal conditioning station 410. Wafer 480 may have already been thermally conditioned in thermal conditioning station 410 before being transported to wafer stage 495 for inspection. Therefore, by obtaining and processing the temperature characteristics of the wafer 480 that has been already thermally preconditioned, controller 450 may determine the effectiveness of thermal conditioning process and reconfigure thermal conditioning station 410 to treat the wafers in pipeline (e.g., wafer 420 and other wafers in FOUPs) more efficiently, thereby improving the overall throughput of charged particle beam inspection system 400. For example, controller 450 may adjust the temperature setpoint of the thermal conditioning process based on the temperature characteristic of wafer 480.

To determine the temperature characteristic of wafer 480, controller 450 may receive, via communication channel 433, some measured characteristics of wafer 480. These characteristics of wafer 480 may include locations of a structures on the wafer or distances between the structures.

The temperature characteristic of wafer 480, in some embodiments, may be information about temperature of wafer 480. The temperature information of wafer 480 may be obtained by direct measurement (e.g., using a contact- or contactless-temperature sensor) or indirect measurement (e.g., analyzing physical properties of wafer 480). One of the ways to indirectly measure the temperature information of wafer 480 is using an alignment data of wafer 480. For example, in some embodiments, controller 450 may receive one or more images of wafer 480 (such as wafer images 710 and 760 of FIG. 7 or wafer images 810, 820, and 830 of FIG. 8) via communication channel 433. The one or more images may be images of one or more portions of wafer 480. In other embodiments, controller 450 may receive scanning data from the electron beam tool in main chamber 490 and construct multiple wafer images or multiple images of portions of the wafer. Controller 450 may then analyze the images of wafer 480 to identify a temperature characteristic of wafer 480. This indirect measurement process is described in further detail with respect to FIGS. 7 and 8 in the following sections.

In some embodiments, controller 450 may receive a heater-temperature data about the temperature of output of heater/cooler 460 via communication channel 432. In such embodiments, controller 450 may dynamically adjust heater/cooler 460 with control signal 434 based on the feedback information (the received heater-temperature data) to control the temperature of conditioning plate 415. For example, in some embodiments, heater/cooler 460 may be a water heater or water cooler. In such embodiments, heated or cooled water flows through heat transfer elements 440 in conditioning plate 415, and controller 450 may receive the heater-temperature data about the temperature of water at the output of heater/cooler 460. Controller 450 may adjust heater/cooler 460 based on the water temperature. Controller 450 may receive an electric signal conveying the heater-temperature data from a temperature sensor 465 configured to measure the temperature of water, via communication channel 432. In some embodiments, controller 450 may use the received heater-temperature data to adjust the temperature setpoint of the thermal conditioning process.

In some embodiments, communication channels 431, 432, and 433 and control signal 434 may comprise a medium such as an electrical conductor, optical fiber cable, portable storage media, IR, Bluetooth, internet, wireless network, wireless radio, among others, or a combination thereof. In some embodiments, controller 450 may be further optimized with additional temperature sensors. For example, in some embodiments, system may additionally include one or more sensors configured to measure the temperature of wafer 420, wafer 480, or conditioning plate 415.

Figure 5:
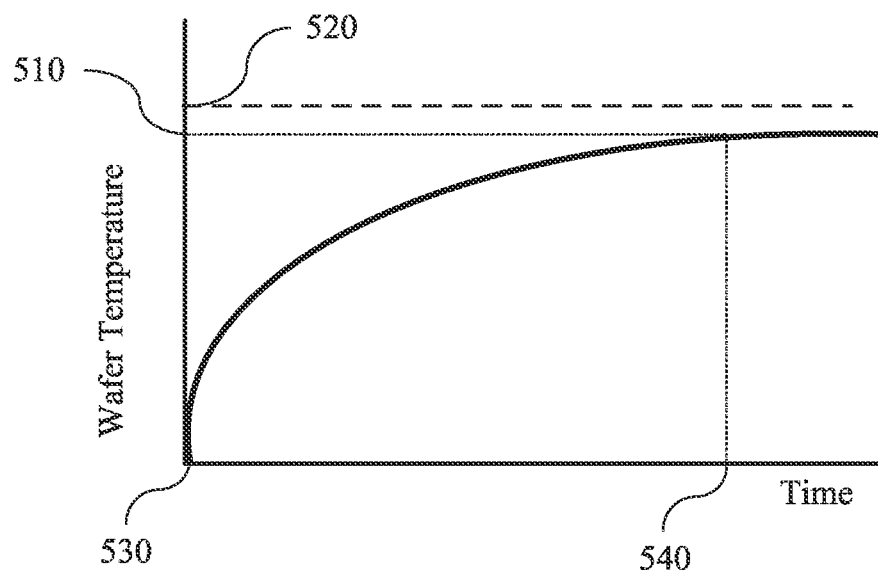
FIGS. 5 and 6 is an exemplary graph showing a wafer temperature change over time in relation to a temperature setpoint of the thermal conditioning process, consistent with embodiments of the present disclosure.

FIG. 5 shows an exemplary graph showing a wafer temperature change over time in a thermal conditioning station (such as thermal conditioning station 410 in FIG. 4), in relation to a temperature setpoint of the thermal conditioning process. The thermal conditioning process begins at time 530. As the heat is transferred to the wafer, the temperature of wafer gradually approaches an equilibrium temperature 510. The thermal conditioning process may continue until time 540, at which the temperature of wafer stabilizes approximately at equilibrium temperature 510. The thermal conditioning station may be controlled by a controller (such as controller 450 of FIG. 4) with a temperature setpoint 520. As shown in FIG. 5, in some embodiments, the controller may drive temperature setpoint 520 to a constant value.

Figure 6:
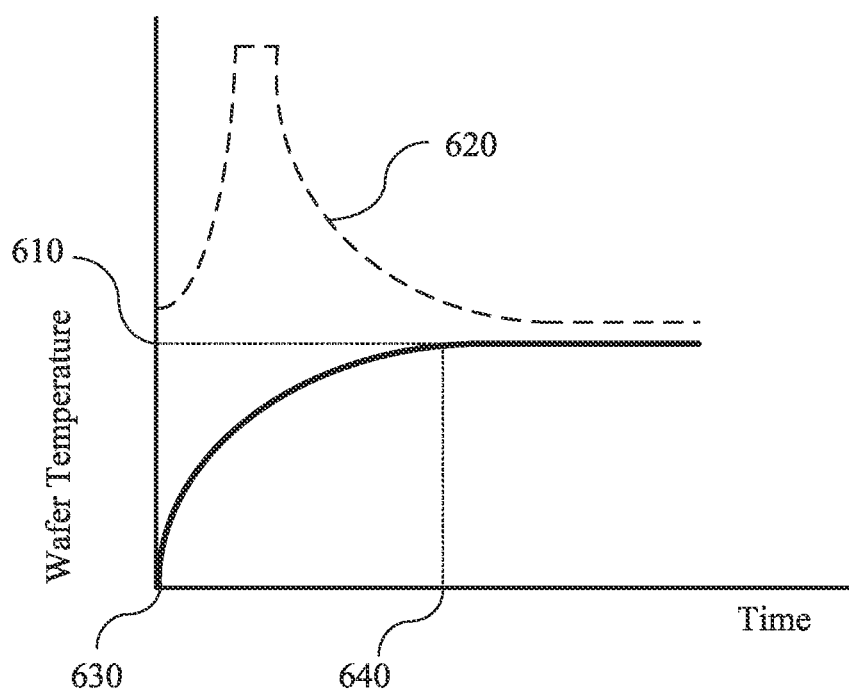

FIG. 6 shows another exemplary graph showing a wafer temperature change over time during wafer temperature conditioning. Similar to an embodiment in FIG. 5, the thermal conditioning process begins at time 630 and ends at time 640, when the temperature of wafer stabilizes approximately at an equilibrium temperature 610. In this embodiment, the controller may adjust a temperature setpoint 620 dynamically in real-time to reduce the time needed for thermal conditioning. For example, temperature setpoint 620 may be set high initially to quickly change the temperature of wafer, then gradually lowered as the wafer temperature approaches towards equilibrium temperature 610.

Figure 7:
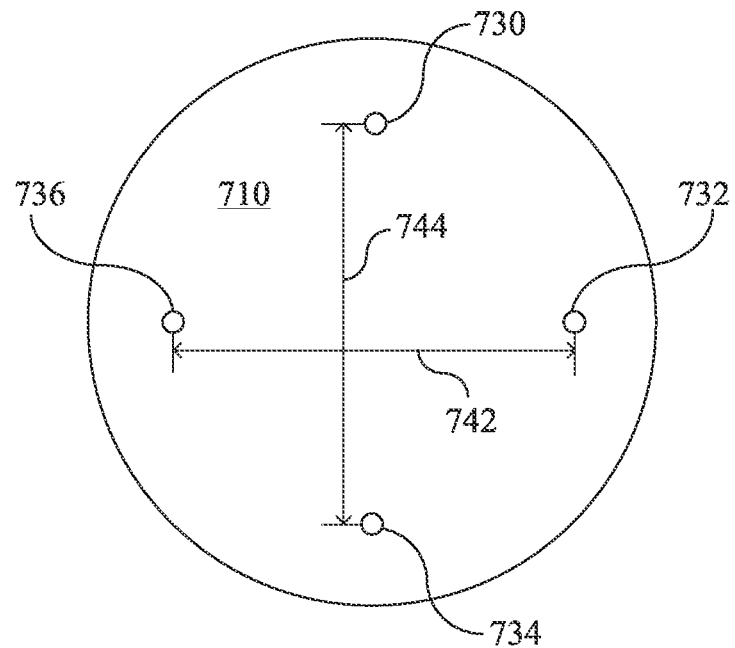
FIGS. 7 and 8 is a schematic diagram illustrating exemplary images of a wafer with a plurality of structures, consistent with embodiments of the present disclosure.
Figure 7:
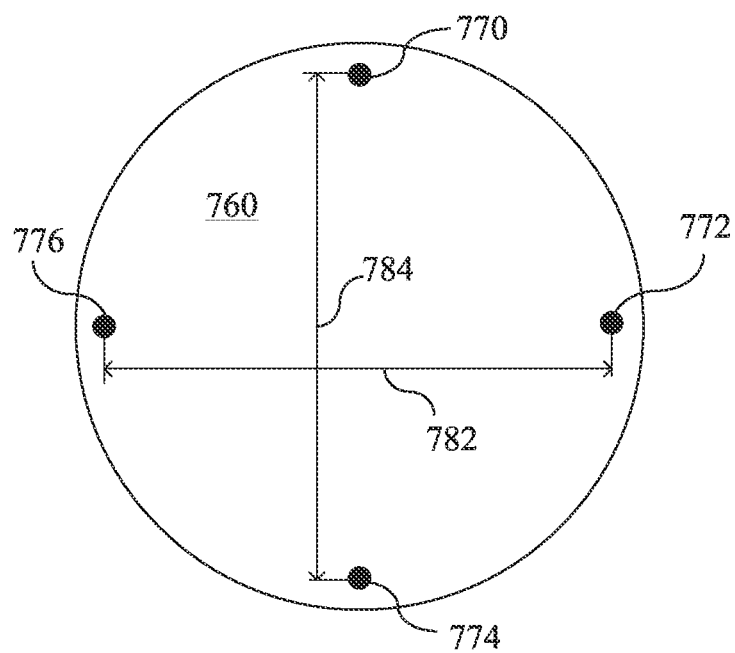

Reference is now made to FIG. 7, which is a schematic diagram illustrating exemplary images of a wafer with a plurality of structures, consistent with embodiments of the present disclosure. In some embodiments, an alignment data of a wafer under inspection (such as wafer 480 of FIG. 4) may be used to determine a temperature characteristic of the wafer (e.g., the temperature information of the wafer). For example, as described with respect to FIG. 4, a controller (such as controller 450 of FIG. 4) may receive one or more images of the wafer. The one or more images may be images of one or more portions of the wafer. The controller may then analyze the received images of the wafer or portions of the wafer to determine a temperature characteristic of wafer. The controller may use the temperature characteristic to adjust the temperature setpoint of the thermal conditioning station (such as thermal conditioning station 410 of FIG. 4).

As shown in FIG. 7, in some embodiments, a wafer image 710 may be compared with a reference wafer image 760 to determine the relative size of the wafer. Based on the relative size of the wafer, the temperature characteristics of the wafer may be determined. For example, if the wafer (as shown in wafer image 710) is smaller than the reference image, the temperature of the wafer may be lower than the corresponding reference temperature. If the wafer is larger than the reference image, the temperature of the wafer may be higher than the corresponding reference temperature.

In such embodiments, a controller (such as controller 450 of FIG. 4) may receive wafer image 710 (or images of portions of the wafer), which shows one or more structures or patterns on the wafer, wherein the structures or the patterns are embedded on the wafer during a semiconductor manufacturing process. Wafer image 710 (or an image of a portion of the wafer) may be compared to the reference so that a relative location of a known structure on the wafer can be found with respect to corresponding structures in the reference. Using similar techniques, the locations of multiple structures in the wafer and the reference may be determined, and also the distances between them based on the SEM scans may be determined. For example, wafer image 710 shows that four such structures at location 730, 732, 734, and 736. The controller may analyze wafer image 710 and determine the locations of the structures on the wafer. The controller may also determine the distances between the structures, such as distance 742 between the structures at locations 732 and 736, and distance 744 between the structures at locations 734 and 730.

In some embodiments, these measured characteristics of the wafer may be compared to the expected characteristics of the wafer in a reference data. The reference data may include a GDS layout data. For example, reference wafer image 760 shows that the structures are expected to be found at locations 770, 772, 774, and 776. Accordingly, the distances between the expected locations of the structures may be obtained, such as distance 782 between the expected locations 772 and 776, and distance 784 between the expected locations 774 and 770. In such embodiments, the controller may compare distances 742, 744 to distances 782, 784, respectively. The controller may determine a wafer scaling factor using the equation below based on the measured distance 742 and 744 and the expected distance 782 and 784:

$$\text{Wafer Scaling Factor} = \frac{1}{2} \times \left( \frac{\text{distance 742}}{\text{distance 782}} + \frac{\text{distance 744}}{\text{distance 784}} \right) \quad \text{(Equation 1)}$$

While Equation 1 shows that the Wafer Scaling Factor may be determined based on a comparison between two measured distances to two expected distances, it is appreciated that the Wafer Scaling Factor may be determined based on a comparison between one or more measured distances to the corresponding expected distances.

In some embodiments, a known temperature of wafer may be associated with reference wafer image 760. In such embodiments, the controller may estimate the actual wafer temperature corresponding to wafer image 710 using equation below:

$$T_{wafer} = T_{reference} + \frac{\text{Wafer Scaling Factor}}{\alpha_{wafer}} \quad \text{(Equation 2)}$$

where, $\alpha_{wafer}$ is the linear expansion coefficient of wafer material (for example, for Silicon, $\alpha_{Si} \approx 2.56 \cdot 10^{-6} \cdot K^{-1}$) and $T_{reference}$ is the known wafer temperature associated with wafer image 760. Some examples of wafer material include germanium, gallium arsenide, among others).

The determined wafer temperature ($T_{wafer}$) may be provided to the controller to adjust the temperature setpoint of a thermal conditioning station (such as thermal conditioning station 410 of FIG. 4).

Figure 8:
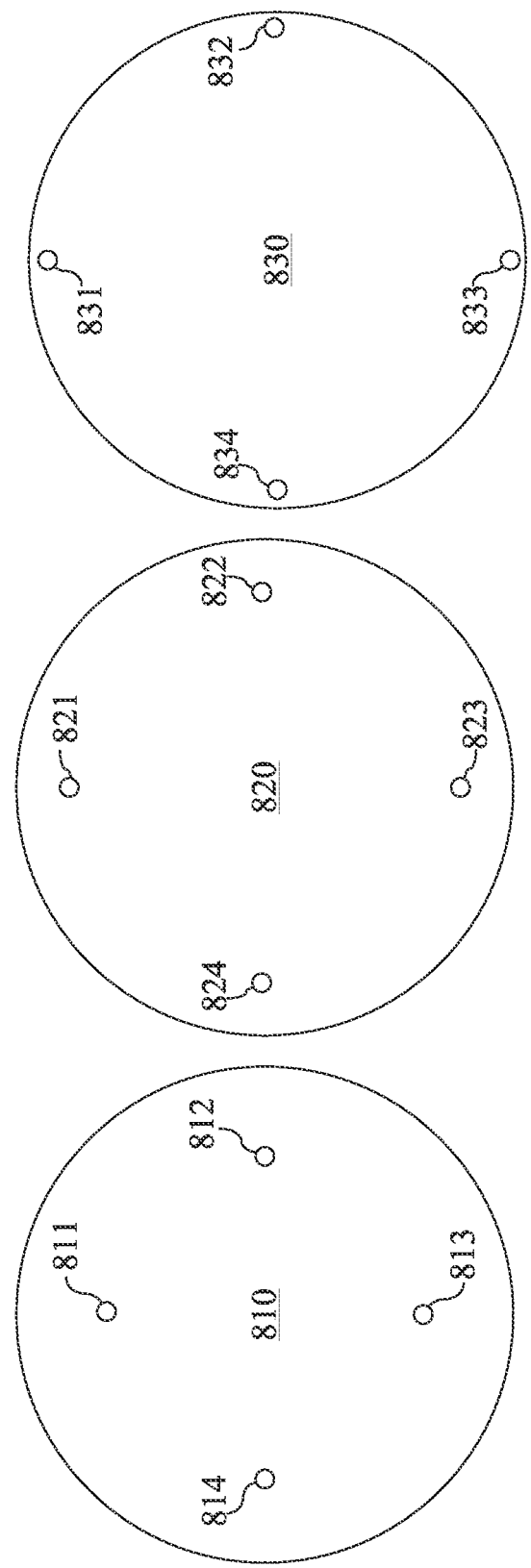

Reference is now made to FIG. 8, which is a schematic diagram illustrating exemplary images of a wafer with a plurality of structures, consistent with embodiments of the present disclosure. In some embodiments, the wafer-level alignment steps may be performed several times over a time sequence to produce multiple images of the wafer. A controller (such as controller 450 of FIG. 4) may analyze those multiple wafer images to obtain the temperature characteristic of the wafer.

As shown in FIG. 8, wafer images 810, 820, and 830 may be produced at different times over a time sequence. As explained with respect to FIG. 3, if the temperature of a wafer under inspection (such as wafer 480 of FIG. 4) is different from the temperature of a wafer stage (such as wafer stage 495 of FIG. 4), the wafer temperature may gradually drift towards the temperature of the wafer stage, thereby resulting in a deformation (e.g., a thermal expansion shown in FIG. 1A) of the wafer. With multiple wafer images taken over a time sequence, the controller may identify the characteristic of the deformation (e.g., rate or speed of expansion), which may be correlated with the change of wafer temperature over time.

For example, wafer images 810, 820, and 830, obtained at time $t_1$, $t_2$, and $t_3$, respectively, show the movement of a plurality of structures on the wafer. In other words, the structures move from locations 811, 812, 813, 814 at time $t_1$, through locations 821, 822, 823, 824 at time $t_2$, and finally to locations 831, 832, 833, 834 at time $t_3$, respectively.

This temperature drift may have the following profile:

$$T_{wafer(t)} - T_{wafer\ stage} = (T_{wafer(0)} - T_{wafer\ stage}) \times e^{-t/\tau} \quad \text{(Equation 3)}$$

where $T_{wafer(t)}$ is the wafer temperature, t is time, $T_{wafer(0)}$ is the wafer temperature at t=0, when the wafer is loaded to the wafer stage; $T_{wafer\ stage}$ is the temperature of the wafer stage. $\tau$ represent the thermal time constant:

$$\tau = \frac{C_{wafer} \times M_{wafer}}{h \times A_{wafer}} \quad \text{(Equation 4)}$$

where $C_{wafer}$ is the heat capacity of silicon, $M_{wafer}$ is the mass of the wafer, h is the heat transfer coefficient between the wafer and the wafer stage, and $A_{wafer}$ is the effective surface area of the wafer.

With multiple measurements of the characteristics of the structures on the wafer, the relative wafer temperatures at several time steps (e.g., $t_1$, $t_2$, and $t_3$) may be determined using the Wafer Scaling Factor equation (Equation 1). Based on these relative wafer temperatures at several time steps, $T_{wafer(0)} - T_{wafer\ stage}$ (i.e., the temperature difference between the wafer and the wafer stage at t=0 when the wafer is loaded to the wafer stage) may be determined with a fitting process. For example, the controller may perform an exponential extrapolation process based on Equation 3 to determine $T_{wafer(0)} - T_{wafer\ stage}$.

The determined $T_{wafer(0)} - T_{wafer\ stage}$ may be provided to the controller to adjust the temperature setpoint of the thermal conditioning station to minimize the wafer temperature drift.

Figure 9:
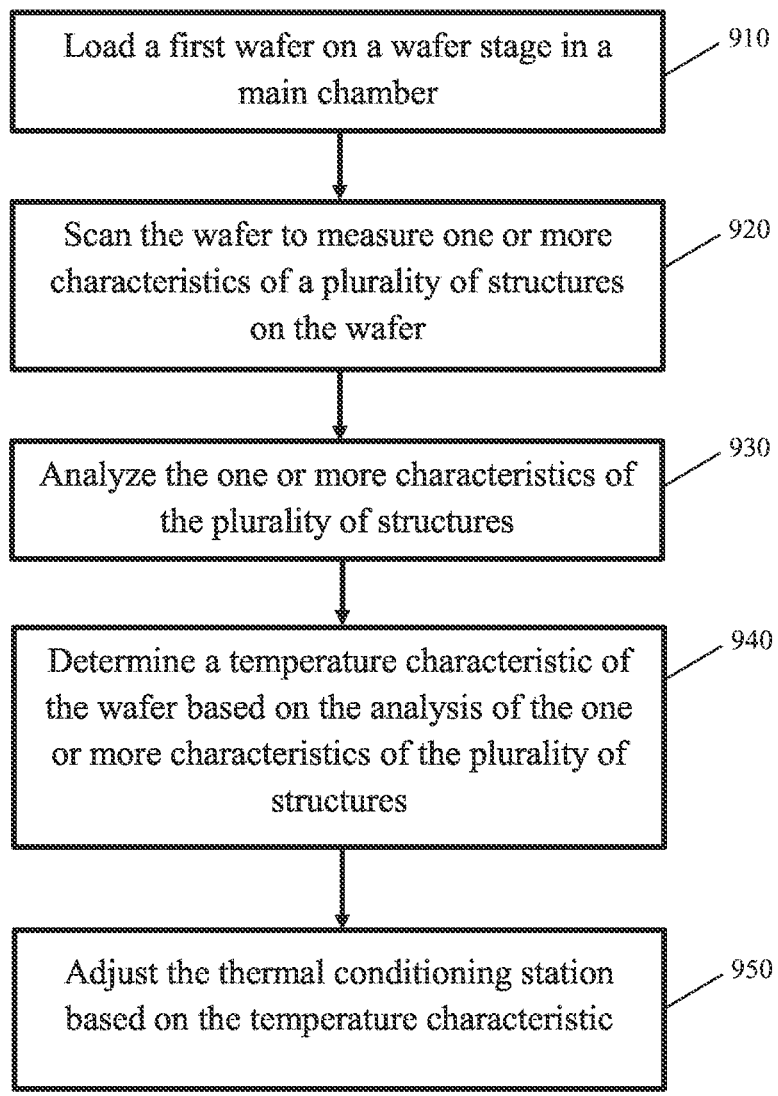
FIG. 9 is a flow chart illustrating an exemplary method for conditioning a wafer temperature, consistent with embodiments of the present disclosure.

Reference is now made to FIG. 9, which is a flow chart illustrating an exemplary method for adjusting a charged particle beam apparatus with a thermal conditioning station, consistent with embodiments of the present disclosure. The method may be performed by a charged particle beam inspection system 400 (such as charged particle beam inspection system 400 of FIG. 4).

In step 910, the inspection system loads a wafer to a wafer stage in a main chamber (such as wafer stage 495 in main chamber 490 of FIG. 4) for inspection. The wafer may have been thermally preconditioned in the thermal conditioning station (such as thermal conditioning station 410 of FIG. 4). In some embodiments, after the wafer (such as wafer 480 of the FIG. 4) is transported to the wafer stage, another wafer (such as wafer 420 of the FIG. 4) may be loaded to the thermal conditioning station while the inspection of the first wafer in is progress in the main chamber. This thermal conditioning before transporting a wafer to the wafer stage for inspection may improve the overall throughput of the inspection system by minimizing a wafer deformation caused by a wafer temperature drift as explained in further details with respect to FIG. 3.

In step 920, the inspection system scans the wafer to measure some wafer characteristics, which can be provided to a controller (such as controller 450 of FIG. 4) for adjusting the thermal conditioning station. For example, the inspection system may scan the wafer and produce one or more images of the wafer (such as wafer images 710 and 760 of FIG. 7 or wafer images 810, 820, and 830 of FIG. 8). These wafer images may show a plurality of structures or patterns on the wafer, wherein the structures or the patterns are embedded on the wafer during a semiconductor manufacturing process. The inspection system may analyze the wafer images and measure the characteristics of the structures. For example, locations of the structures or distances between the structures may be identified through the analysis.

In step 930, the inspection system analyzes the identified characteristics of the structures to determine a temperature characteristic of the wafer. In some embodiments, as explained in detail with respect to FIG. 7, the controller of the inspection system may compare the measured locations of the structures to corresponding locations of the structures in a reference data to determine a temperature characteristic of the wafer. In some embodiments, as explained in detail with respect to FIG. 8, the inspection system may produce multiple wafer images at different times over a time sequence and compare the characteristics of the structures in those multiple images to determine the temperature characteristic of the wafer.

In step 940, the controller of the inspection system determines the temperature characteristic of the wafer based on the measured characteristics of the structures, including the locations of the structures and the distances between the structures. In some embodiments, the temperature characteristic of the wafer may comprise an actual temperature of the wafer. In other embodiments, the temperature characteristic of the wafer may comprise an initial temperature difference between the wafer and the wafer stage (e.g., the temperature difference when the wafer is initially loaded onto the wafer stage for inspection).

In step 950, the controller adjusts the thermal conditioning stations based on the determined temperature characteristic of the wafer. For example, the controller may adjust the temperature setpoint of the thermal conditioning station to improve the efficiency of thermal conditioning on the wafers in pipeline (e.g., wafer 420 of FIG. 4 and other wafers in FOUPs).

The embodiments may further be described using the following clauses:

1. A method for determining a temperature characteristic of a wafer using a charged particle beam apparatus, the wafer including a plurality of structures, comprising:
    scanning the wafer with the charged particle beam apparatus to measure one or more characteristics of the plurality of structures on the wafer;
    analyzing the one or more characteristics of the plurality of structures; and
    determining the temperature characteristic based on the analysis of the one or more characteristics of the plurality of structures.
2. The method of clause 1, wherein the temperature characteristic of the wafer comprises a temperature of the wafer.
3. The method of any one of clauses 1 and 2, further comprising:
    comparing the one or more characteristics to corresponding one or more characteristics in a reference data.
4. The method of clause 3, wherein the one or more characteristics of the plurality of structures comprise locations of the plurality of structures.
5. The method of clause 3, wherein the one or more characteristics of the plurality of structures comprise a distance between the plurality of structures.
6. The method of any one of clauses 3 to 5, wherein the reference data comprises a GDS layout data.
7. The method of any one of clauses 3 to 5, wherein the reference data comprises a scan data by a charged particle beam apparatus.
8. The method of any one of clauses 3 to 7, wherein the reference data is associated with a known temperature of the wafer.
9. The method of any one of clauses 3 to 8, wherein the reference data comprises a determined temperature characteristic of a previously analyzed wafer.
10. The method of any one of clauses 1 and 2, further comprising:
    measuring a first set of the one or more characteristics of the plurality of structures at a first time over a time sequence;
    measuring a second set of the one or more characteristics of the plurality of structures at a second time over the time sequence; and
    comparing the first set and the second set of the one or more characteristics of the plurality of structures.
11. The method of clause 10, wherein the one or more characteristics of the plurality of structures comprise locations of the plurality of structures.
12. The method of clause 10, wherein the one or more characteristics of the plurality of structures comprise a distance between the plurality of structures.
13. The method of any one of clauses 1 to 12, further comprising:
    providing the temperature characteristic to a controller of the charged particle beam apparatus; and
    adjusting a thermal conditioning station to thermally precondition a next wafer to be inspected.
14. A non-transitory computer readable medium including a set of instructions that is executable by one or more processors of a controller to cause the controller to perform a method for determining a temperature characteristic of a wafer using a charged particle beam apparatus, the wafer including a plurality of structures, the method comprising:
   scanning the wafer with the charged particle beam apparatus to measure one or more characteristics of the plurality of structures on the wafer;
   analyzing the one or more characteristics of the plurality of structures; and
   determining the temperature characteristic based on the analysis of the one or more characteristics of the plurality of structures.

15. The computer readable medium of clause 14, wherein the temperature characteristic of the wafer comprises a temperature of the wafer.

16. The computer readable medium of any one of clauses 14 and 15, wherein the set of instructions that is executable by the one or more processors of the controller to cause the controller to further perform:
   comparing the one or more characteristics to corresponding one or more characteristics in a reference data.

17. The computer readable medium of clause 16, wherein the one or more characteristics of the plurality of structures comprise locations of the plurality of structures.

18. The computer readable medium of clause 16, wherein the one or more characteristics of the plurality of structures comprise a distance between the plurality of structures.

19. The computer readable medium of any one of clauses 16 to 18, wherein the reference data comprises a GDS layout data.

20. The computer readable medium of any one of clauses 16 to 18, wherein the reference data comprises a scan data by a charged particle beam apparatus.

21. The computer readable medium of any one of clauses 16 to 20, wherein the reference data is associated with a known temperature of the wafer.

22. The computer readable medium of any one of clauses 16 to 21, wherein the reference data comprises a determined temperature characteristic of a previously analyzed wafer.

23. The computer readable medium of any one of clauses 14 and 15, wherein the set of instructions that is executable by the one or more processors of the controller to cause the controller to further perform:
   measuring a first set of the one or more characteristics of the plurality of structures at a first time over a time sequence;
   measuring a second set of the one or more characteristics of the plurality of structures at a second time over the time sequence; and
   comparing the first set and the second set of the one or more characteristics of the plurality of structures.

24. The computer readable medium of clause 23, wherein the one or more characteristics of the plurality of structures comprise locations of the plurality of structures.

25. The computer readable medium of clause 23, wherein the one or more characteristics of the plurality of structures comprise a distance between the plurality of structures.

26. The computer readable medium of any one of clauses 14 to 25, wherein the set of instructions that is executable by the one or more processors of the controller to cause the controller to further perform:
   providing the temperature characteristic to a controller of the charged particle beam apparatus; and
   adjusting a thermal conditioning station to thermally precondition a next wafer to be inspected.

27. A method for adjusting a charged particle beam apparatus with a thermal conditioning station, comprising:
   scanning a wafer on a wafer stage with the charged particle beam apparatus to measure one or more characteristics of a plurality of structures on the wafer;
   analyzing the one or more characteristics of the plurality of structures;
   determining a temperature characteristic of the wafer based on the analysis of the one or more characteristics of the plurality of structures; and
   adjusting the thermal conditioning station based on the temperature characteristic.

28. The method of clause 27, wherein analyzing the one or more characteristics of the plurality of structures comprises:
   obtaining one or more images of the wafer,
   measuring the one or more characteristics of the plurality of structures of the wafer based on the one or more images, and
   comparing the one or more characteristics of the plurality of structures to corresponding one or more characteristics of the plurality of structures in a reference data.

29. The method of clause 28, wherein the one or more characteristics of the plurality of structures comprise locations of the plurality of structures.

30. The method of clause 28, wherein the one or more characteristics of the plurality of structures comprise a distance between the plurality of structures.

31. The method of any one of the clauses 28 to 30, wherein the reference data are associated with a known temperature of the wafer.

32. The method of any one of clauses 28 to 31, wherein the reference data comprises a determined temperature characteristic of a previously analyzed wafer.

33. The method of clause 27, wherein analyzing the one or more characteristics of the plurality of structures comprises:
   obtaining a first image of the wafer at a first time over a time sequence,
   obtaining a second image of the wafer at a second time over the time sequence,
   measuring a first set of the one or more characteristics based on the first image,
   measuring a second set of the one or more characteristics based on the second image, and
   comparing the first set and the second set of the one or more characteristics of the plurality of structure.

34. The method of clause 33, wherein the one or more characteristics of the plurality of structures comprise locations of the plurality of structures.

35. The method of clause 33, wherein the one or more characteristics of the plurality of structures comprise a distance between the plurality of structures.

36. The method of any one of clauses 33 to 35, further comprising:
   obtaining a third image of the wafer at a third time over the time sequence;
   measuring a third set of the one or more characteristics based on the third image; and conducting an extrapolation process based on the first set, the second set, and the third set of the one or more characteristics of the plurality of structure.
37. The method of clause 36, wherein the extrapolation comprises an exponential extrapolation.
38. The method of any one of clauses 27 to 37, wherein the thermal conditioning station comprises a load lock unit.
39. The method of any one of clauses 27 to 38, further comprising:
identifying an alignment characteristic of the wafer at a local level; and
determining whether the thermal conditioning station needs to be adjusted.
40. A charged particle beam apparatus, comprising:
a thermal conditioning station configured to precondition a wafer temperature;
a particle beam imaging tool to generate one or more images of a wafer on a wafer stage; and
a controller having circuitry to cause the charged particle beam apparatus to perform:
scanning the wafer with the particle beam imaging tool to measure one or more characteristics of a plurality of structures on the wafer;
analyzing the one or more characteristics of the plurality of structures;
determining a temperature characteristic of the wafer based on the analysis of the one or more characteristics of the plurality of structures; and
adjusting the thermal conditioning station based on the temperature characteristic.
41. The apparatus of clause 40, wherein the controller performing analyzing the one or more characteristics of the plurality of structures comprises:
obtaining the one or more images of the wafer,
measuring the one or more characteristics of the plurality of structures of the wafer based on the one or more images, and
comparing the one or more characteristics of the plurality of structures to corresponding one or more characteristics of the plurality of structures in a reference data.
42. The apparatus of clause 41, wherein the one or more characteristics of the plurality of structures comprise locations of the plurality of structures.
43. The apparatus of clause 41, wherein the one or more characteristics of the plurality of structures comprise a distance between the plurality of structures.
44. The apparatus of any one of the clauses 41 to 43, wherein the reference data are associated with a known temperature of the wafer.
45. The apparatus of any one of the clauses 41 to 44, wherein the reference data comprises a determined temperature characteristic of a previously analyzed wafer.
46. The apparatus of clause 40, wherein the controller performing analyzing the one or more characteristics of the plurality of structures comprises:
obtaining a first image of the wafer at a first time over a time sequence,
obtaining a second image of the wafer at a second time over the time sequence,
measuring a first set of the one or more characteristics based on the first image,
measuring a second set of the one or more characteristics based on the second image, and
comparing the first set and the second set of the one or more characteristics of the plurality of structure.
47. The apparatus of clause 46, wherein the one or more characteristics of the plurality of structures comprise locations of the plurality of structures.
48. The apparatus of clause 46, wherein the one or more characteristics of the plurality of structures comprise a distance between the plurality of structures.
49. The apparatus of any one of clauses 46 to 48, wherein the controller performing analyzing the one or more characteristics of the plurality of structures further comprises:
obtaining a third image of the wafer at a third time over the time sequence;
measuring a third set of the one or more characteristics based on the third image; and
conducting an extrapolation process based on the first set, the second set, and the third set of the one or more characteristics of the plurality of structure.
50. The apparatus of clause 49, wherein the extrapolation comprises an exponential extrapolation.
51. The apparatus of any one of clauses 40 to 50, wherein the thermal conditioning station comprises a load lock unit.
52. The apparatus of any one of clauses 40 to 51, wherein the controller further performs:
identifying an alignment characteristic of the wafer at a local level, and determining whether the thermal conditioning station needs to be adjusted.

It is appreciated that a controller of the wafer conditioning system could use software to control the functionality described above. For example, the controller may produce multiple images of wafers. The controller may analyze the images of wafers and determine a temperature characteristic of the wafer. The controller may send instructions to a heater/cooler (such as heater/cooler 460 of FIG. 4) to adjust the temperature of heat transfer elements. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

Although the disclosed embodiments have been explained in relation to its preferred embodiments, it is to be understood that other modifications and variation can be made without departing the spirit and scope of the subject matter as hereafter claimed.

The invention claimed is:
1. A non-transitory computer readable medium including a set of instructions that is executable by one or more processors of a controller to cause the controller to perform a method for adjusting a charged particle beam apparatus with a thermal conditioning station, the method comprising:
acquiring one or more characteristics of a plurality of structures on a wafer on a wafer stage, wherein a temperature of the wafer is preconditioned by the thermal conditioning station before the wafer is transferred onto the wafer stage for scanning with the charged particle beam apparatus;
determining a temperature characteristic based on the one or more characteristics of the plurality of structures on the wafer; and adjusting the thermal conditioning station based on the temperature characteristic of the wafer.

2. The computer readable medium of claim 1, wherein the temperature characteristic of the wafer comprises a temperature of the wafer.

3. The computer readable medium of claim 1, wherein, in acquiring one or more characteristics of the plurality of structures on the wafer, the set of instructions that is executable by the one or more processors of the controller to cause the controller to perform:

scanning the wafer on the wafer stage with the charged particle beam apparatus to measure the one or more characteristics of the plurality of structures on the wafer.

4. The computer readable medium of claim 3, wherein the set of instructions that is executable by the one or more processors of the controller to cause the controller to further perform:

comparing the one or more characteristics to corresponding one or more characteristics in a reference data.

5. The computer readable medium of claim 4, wherein the one or more characteristics of the plurality of structures comprise locations of the plurality of structures.

6. The computer readable medium of claim 4, wherein the one or more characteristics of the plurality of structures comprise a distance between the plurality of structures.

7. The computer readable medium of claim 4, wherein the reference data comprises GDS layout data.

8. The computer readable medium of claim 4, wherein the reference data comprises a scan data by a charged particle beam apparatus.

9. The computer readable medium of claim 4, wherein the reference data is associated with a known temperature of the wafer.

10. The computer readable medium of claim 4, wherein the reference data comprises a determined temperature characteristic of a previously analyzed wafer.

11. The computer readable medium of claim 3, wherein the set of instructions that is executable by the one or more processors of the controller to cause the controller to further perform:

measuring a first set of the one or more characteristics of the plurality of structures at a first time over a time sequence;

measuring a second set of the one or more characteristics of the plurality of structures at a second time over the time sequence; and comparing the first set and the second set of the one or more characteristics of the plurality of structures.

12. The computer readable medium of claim 11, wherein the one or more characteristics of the plurality of structures comprise locations of the plurality of structures.

13. The computer readable medium of claim 12, wherein the one or more characteristics of the plurality of structures comprise a distance between the plurality of structures.

14. The computer readable medium of claim 1, wherein the set of instructions that is executable by the one or more processors of the controller to cause the controller to further perform:

providing the temperature characteristic to a controller of the charged particle beam apparatus; and adjusting the thermal conditioning station to thermally precondition a subsequent wafer to be inspected.

15. The computer readable medium of claim 3, wherein, in acquiring one or more characteristics of the plurality of structures on the wafer, the set of instructions that is executable by the one or more processors of the controller to cause the controller to perform:

obtaining one or more images of the wafer;

measuring the one or more characteristics of the plurality of structures based on the one or more images; and comparing the one or more characteristics of the plurality of structures to corresponding one or more characteristics of the plurality of structures in a reference data.

16. The computer readable medium of claim 3, wherein, in acquiring one or more characteristics of the plurality of structures on the wafer, the set of instructions that is executable by the one or more processors of the controller to cause the controller to perform:

obtaining a first image of the wafer at a first time over a time sequence;

obtaining a second image of the wafer at a second time over the time sequence;

measuring a first set of the one or more characteristics based on the first image;

measuring a second set of the one or more characteristics based on the second image; and comparing the first set and the second set of the one or more characteristics of the plurality of structures.

17. The computer readable medium of claim 16, wherein, in acquiring one or more characteristics of the plurality of structures on the wafer, the set of instructions that is executable by the one or more processors of the controller to cause the controller to further perform:

obtaining a third image of the wafer at a third time over the time sequence;

measuring a third set of the one or more characteristics based on the third image; and conducting an extrapolation process based on the first set, the second set, and the third set of the one or more characteristics of the plurality of structures.

18. The computer readable medium of claim 17, wherein the extrapolation comprises an exponential extrapolation.

19. The computer readable medium of claim 1, wherein the thermal conditioning station comprises a load lock unit.

20. The computer readable medium of claim 1, wherein the set of instructions that is executable by the one or more processors of the controller to cause the controller to further perform:

identifying an alignment characteristic of the wafer at a local level; and determining whether the thermal conditioning station needs to be adjusted.

* * * * *